United States Patent
Hsieh et al.

(10) Patent No.: US 10,262,882 B2
(45) Date of Patent: Apr. 16, 2019

(54) SEMICONDUCTOR WAFER TRANSPORTATION

(71) Applicant: Taiwan Semiconductor Manufacturing Co., Ltd., Hsinchu (TW)

(72) Inventors: Wen-Yao Hsieh, Sanchong (TW); Shao-Hao Chiu, Jubei (TW); Wen-Kai Hsieh, Hsinchu (TW); Lin Hung Kai, Hsinchu (TW); Si-Heng Liu, Jubei (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 15/843,187

(22) Filed: Dec. 15, 2017

(65) Prior Publication Data

US 2018/0108550 A1 Apr. 19, 2018

Related U.S. Application Data

(62) Division of application No. 14/181,031, filed on Feb. 14, 2014, now Pat. No. 9,852,934.

(51) Int. Cl.
*H01L 21/673* (2006.01)
*H01L 21/677* (2006.01)

(52) U.S. Cl.
CPC .... *H01L 21/67379* (2013.01); *H01L 21/6773* (2013.01); *H01L 21/67733* (2013.01)

(58) Field of Classification Search
CPC ......... H01L 21/67379; H01L 21/67733; H01L 21/6773; H01L 21/67373; B65G 17/20; B65G 1/0457; B65G 1/0464; B65G 63/004; B65G 2201/0297; B66C 19/002; B66C 17/20; B66C 1/42
See application file for complete search history.

(56) References Cited

U.S. PATENT DOCUMENTS

| | | |
|---|---|---|
| 2,701,065 A | 2/1955 | Bertel |
| 5,415,517 A | 5/1995 | Lanigan |
| 5,664,679 A | 9/1997 | Schneider |
| 6,896,470 B1 | 5/2005 | Chen et al. |
| 7,823,730 B2 | 11/2010 | Mimura |
| 8,881,907 B2 | 11/2014 | Yamagishi |
| 9,209,054 B2 | 12/2015 | Hara |

(Continued)

FOREIGN PATENT DOCUMENTS

| | | |
|---|---|---|
| CN | 1478293 | 2/2004 |
| CN | 1849251 | 10/2006 |

(Continued)

*Primary Examiner* — Glenn F Myers
(74) *Attorney, Agent, or Firm* — Haynes and Boone, LLP (57) ABSTRACT

A method includes causing a carrier of an overhead hoist transfer system (OHT) to latch onto a top latch of a first semiconductor wafer transportation pod, the first semiconductor wafer transportation pod comprising a top latching mechanism configured to selectively connect to another pod or a carrier mechanism of an overhead hoist transfer (OHT) system, and a bottom latching mechanism configured to selectively connect to another pod. The method further includes rotating the first semiconductor wafer transportation pod such that the top latching mechanism of the first semiconductor wafer transportation pod latches on to a second semiconductor wafer transportation pod.

20 Claims, 5 Drawing Sheets

(56) References Cited

U.S. PATENT DOCUMENTS

| | | | |
|---|---|---|---|
| 2002/0114686 A1 | 8/2002 | Glynn et al. | |
| 2004/0126208 A1 | 7/2004 | Tawyer et al. | |
| 2006/0257233 A1 | 11/2006 | Bonora et al. | |
| 2008/0193270 A1 | 8/2008 | Yoshida | |
| 2009/0276082 A1 | 11/2009 | Murata | |
| 2012/0128452 A1 | 5/2012 | Murata et al. | |
| 2015/0235883 A1 | 8/2015 | Hsieh et al. | |

FOREIGN PATENT DOCUMENTS

| | | |
|---|---|---|
| CN | 1292967 | 1/2007 |
| DE | 4317996 | 12/1994 |
| DE | 10023436 | 11/2001 |
| JP | 2010126301 | 6/2010 |
| JP | 2011029550 | 2/2011 |
| TW | 201345815 | 11/2013 |
| WO | WO0247118 | 6/2002 |
| WO | WO2012043110 | 4/2012 |

SEMICONDUCTOR WAFER TRANSPORTATION

PRIORITY INFORMATION

This application is a divisional of U.S. patent application Ser. No. 14/181,031 filed Feb. 14, 2014 and entitled "Semiconductor Wafer Transportation," the disclosure of which is hereby incorporated by reference in its entirety.

BACKGROUND

In semiconductor technologies, a semiconductor wafer is processed through various fabrication steps to form integrated circuits defined in multiple chips. Those fabrication steps include lithography patterning, etching, ion implantation, deposition, oxidation and thermal annealing. Different tools are used to perform these different types of processes on semiconductor wafers. Thus, the wafers must be transferred between tools after each process is performed.

It is generally desirable to avoid human contact with the semiconductor wafers as they are transferred because various contaminants or static discharges may harm the wafers. Thus, wafer transportation pods such as front opening universal pods (FOUPs), which provide a controlled environment, are used to move the semiconductor wafers throughout the fabrication facility to different tools. Robotic mechanisms are used to remove semiconductor wafers and insert them into the fabrication tools.

In some cases, the FOUPs are transported through the fabrication facility by an overhead hoist transfer (OHT) system. The OHT includes several tracks above the ground. A carrier device moves along the tracks and can be lowered to pick up or drop off FOUPs as needed. In order to improve the efficiency of semiconductor fabrication, it is desirable to find ways to increase the efficiency of FOUP transportation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
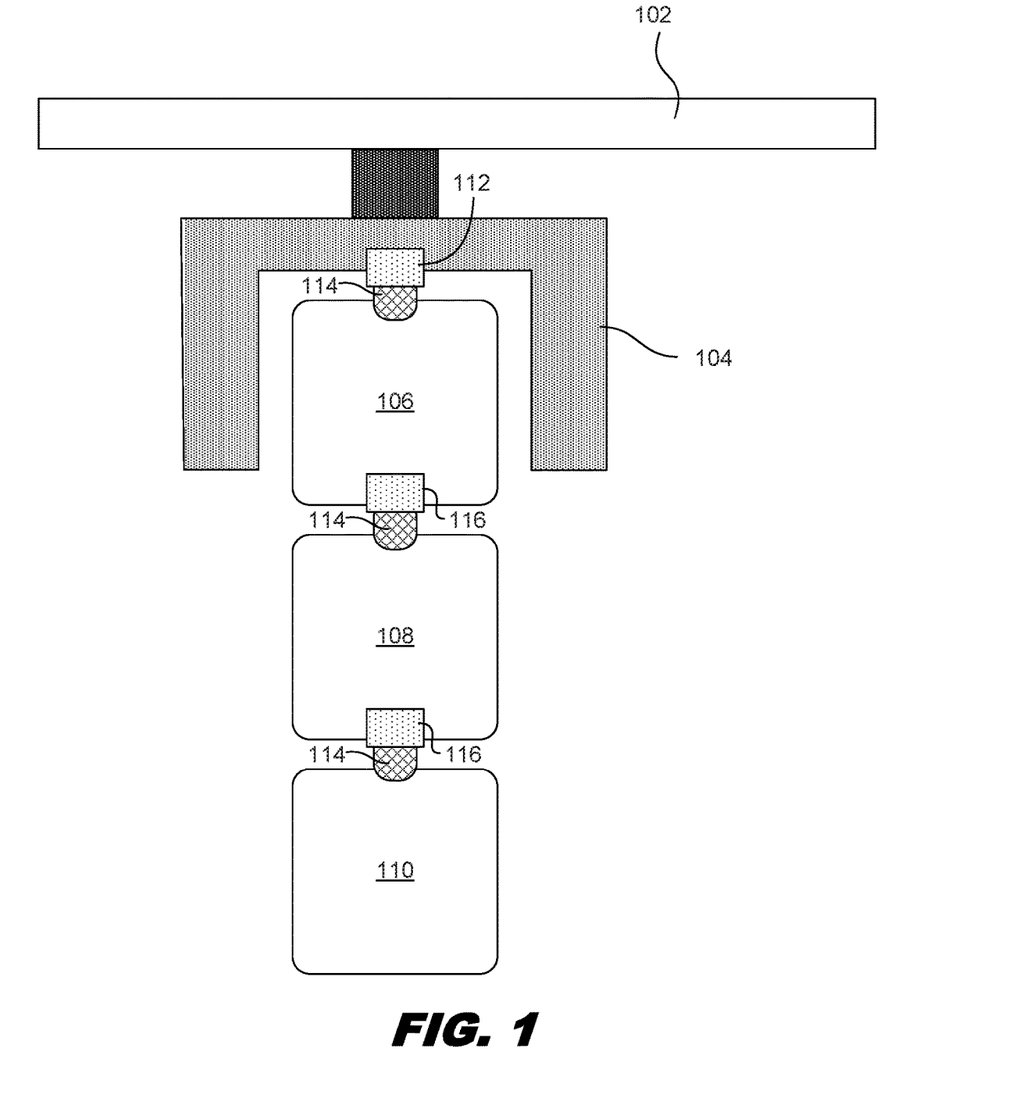
FIG. 1 is a diagram showing an illustrative carrier of an OHT that holds more than one semiconductor wafer transportation pod, in accordance with some embodiments.

FIG. 1 is a diagram showing an illustrative carrier of an OHT that holds more than one semiconductor wafer transportation pod, or FOUP 106, 108, 110. According to the present example, a carrier 104 is connected to an OHT system 102. The carrier 104 includes a carrier latch 112 that connects to a top latch 114 of a first FOUP 106. The first FOUP 106 has a bottom latch 116 that connects to the top latch 114 of a second FOUP 108. Likewise, a third FOUP 110 is connected to the bottom of the second FOUP 108.

The OHT 102 includes several tracks that run throughout a semiconductor fabrication facility. Typically, these tracks run along, or are suspended from, the ceiling of the facility. The OHT 102 may include several switched tracks on which several carriers 104 can travel. The tracks run between the various locations of fabrication tools. For example, a track might run from an etching tool to an implanting tool or an annealing tool. As such, when the semiconductor wafers finish the etching process, they can be moved by the OHT 102 to the tool for the next step in the fabrication process.

The carrier 104 connects to the track and may be lowered to pick up a FOUP for transportation to the next tool. The carrier 104 thus includes a carrier latch 112 that is designed to latch onto the top of a FOUP 106. Typically, carriers 104 are designed to hold only one FOUP. But, according to principles described herein, the FOUPs 106, 108, 110 can be designed so that multiple FOUPs can be moved by one carrier 104. This increases the efficiency of transportation.

For example, the first FOUP 106 has a bottom latch 116 that matches the carrier latch 112. Thus, the second FOUP 108, which is identical to the first FOUP 106, can user its top latch 114 to connect to the bottom latch 116 of the first FOUP 106. Likewise, the third FOUP 110 can user its top latch 114 to connect to the bottom latch 116 of the second FOUP 108.

Figure 2:
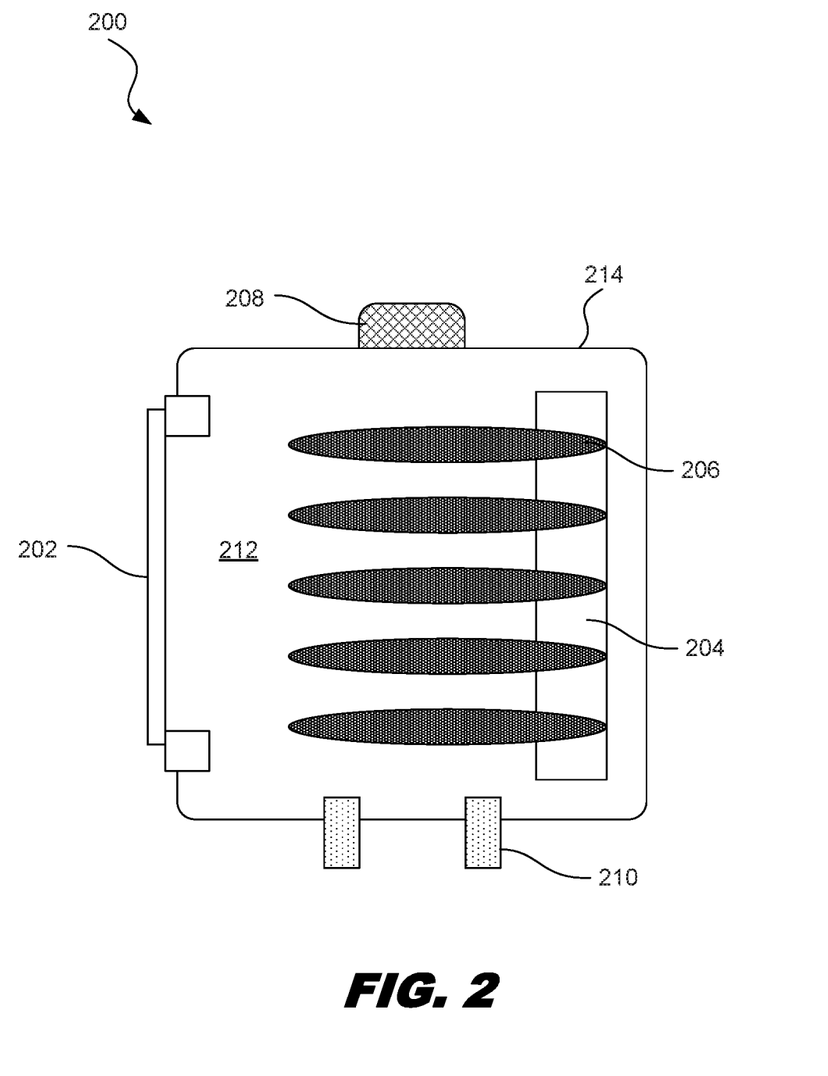
FIG. 2 is a diagram showing an illustrative semiconductor wafer transportation pod having a top latch and a bottom latch, in accordance with some embodiments.

FIG. 2 is a diagram showing an illustrative semiconductor wafer transportation pod 200 having a top latch 208 and a bottom latch 210. The semiconductor wafer transportation pod 200 may be, for example, a FOUP 200. The FOUP 200 includes a body 214, a main compartment 212, a door 202, and a holding device 204 to hold semiconductor wafers 206.

As described above, a FOUP is a universal pod used to transport semiconductor wafers 206 through a fabrication facility. The FOUP may have a body 214 made of a variety of materials such as plastic. The body 214 may completely enclose the main compartment 212 in order to provide a controlled environment. The controlled environment is free from various contaminants such as dust particles. Such particles can adversely affect the circuitry being formed on the semiconductor wafers 206.

The front door 202 of the FOUP is designed to engage a controlled environment within a fabrication tool. Thus, once the FOUP 200 is engaged with the tool, a robotic arm within the tool may remove the semiconductor wafers and position them for processes to be performed by that tool. This is done without exposing the semiconductor wafers 206 to an uncontrolled environment that may contain contaminants or static discharges.

The FOUP 200 includes a top latch 208 that is designed to latch onto a carrier latch of a carrier. In some examples, the top latch 208 is positioned at the center of the top side of the FOUP 200. In some examples, a FOUP 200 may include multiple latches on the top to connect to multiple corresponding latches on the bottom side of the carrier. For example, there may be four latches, one on each corner of the top side of the FOUP 200.

The FOUP 200 also includes a bottom latch 210. The bottom latch 210 may match the latch on the carrier. Thus, the bottom latch 210 is configured to connect to the top latch 208 of another similar FOUP. With each FOUP having a standard top latch 208 and bottom latch 210, several similar FOUPs can be connected to a single carrier. Thus, more FOUPs can be transported within a particular time frame.

In one example, the top latch 208 and bottom latch 210 may form a joint that is similar to a tenon and mortise joint. Such a joint includes a peg-like structure (tenon) and a hole-like structure (mortise) into which the peg-like structure fits. In one example, the top latch may be a tenon-like structure and the bottom latch 210, and carrier latch, may be a mortise-like structure.

Figure 3A:
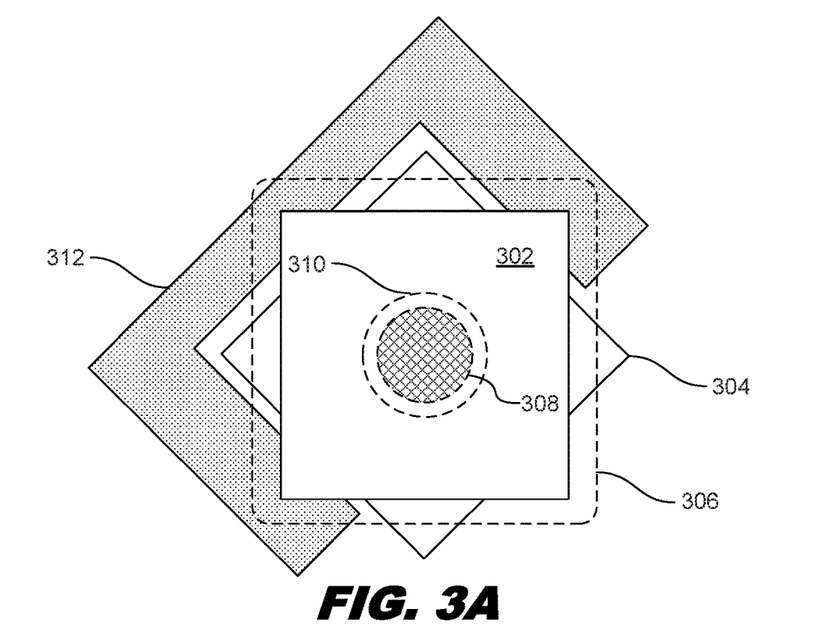
FIGS. 3A and 3B are diagrams showing illustrative top views of multiple semiconductor wafer transportation pods, in accordance with some embodiments.
Figure 3B:
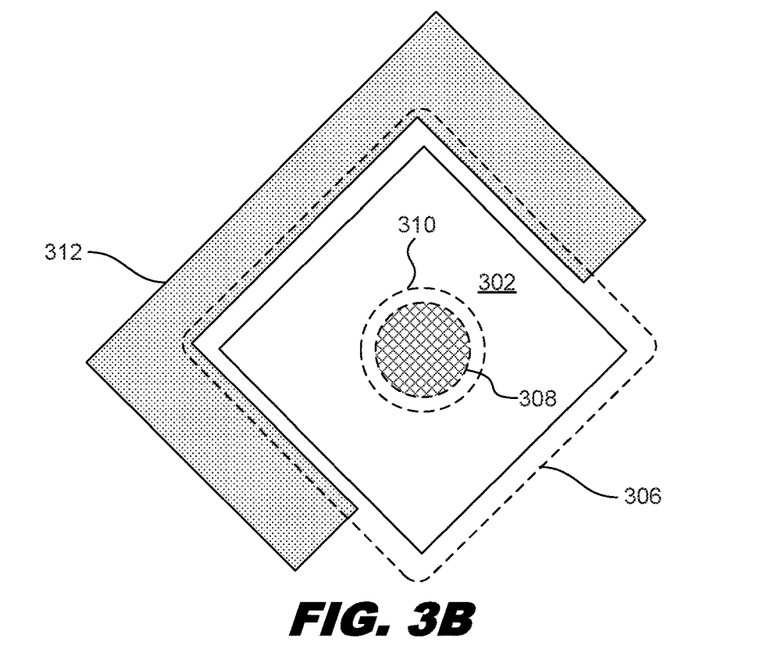

FIGS. 3A-3B are diagrams showing illustrative top views of multiple semiconductor wafer transportation pods. FIG. 3A illustrates a top view of a first FOUP 302 and a second FOUP 304 before a latching process is complete. According to certain illustrative examples, the latches on the FOUPs may be configured to latch or unlatch based on rotation.

According to the present example, to connect the top latch 308 of the second FOUP 304 to the bottom latch 310 of the first FOUP 302, the top latch 308 may be inserted into the bottom latch 310 of the first FOUP 302 while the second FOUP 304 is at an angle with respect to the first FOUP 302. The top latch 308 of the second FOUP 304 and the bottom latch of the first FOUP 310 are illustrated with dotted lines, indicating that they are not on top of the first FOUP 302. Rather, the top latch 308 and bottom latch 310 are between the first FOUP 302 and the second FOUP 304.

To complete the latching process, after the top latch 308 is inserted into the bottom latch 310 while the FOUPs 302, 304 are at an angle with respect to each other, the carrier 306, which is secured to the first FOUP 302, can rotate. Meanwhile, a loading (or unloading) mechanism 312 secures the second FOUP 304 in place so that it does not rotate. The rotation may continue until the FOUPs 302, 304 are aligned.

FIG. 3B is a diagram showing a top view of the FOUPs 302, 304 after the latching process is complete. Specifically, the first FOUP 302 is now aligned with the second FOUP 304. The carrier 306 can now be raised to transport both FOUPs 302, 304.

In some examples, the carrier 306 may pick up a third FOUP (not shown). This is done in a manner similar to the latching of the first FOUP 302 and second FOUP 304. Specifically, the top latch of the third FOUP is inserted into a bottom latch of the second FOUP 304 while the third FOUP is at an angle with respect to the second FOUP 304. The second FOUP may also remain aligned to the first FOUP 302. The carrier 306 then rotates both the first FOUP 302 and second FOUP 304 to complete the latching process to the third FOUP. Thus, all three FOUPs are aligned and ready for transport.

The unloading/unlatching process is similar to the latching process. Specifically, the carrier 306 may lower the second FOUP 304 into the loading tool 312. The carrier 306 may then rotate while the loading tool 312 secures the second FOUP. Thus, the first FOUP 302 will turn with respect to the second FOUP 304. The rotation will continue until the unlatching process is complete. The carrier 306 can then be raised while the first FOUP 302 is still attached and the second FOUP 304 is left with the loading tool 312.

Figure 4:
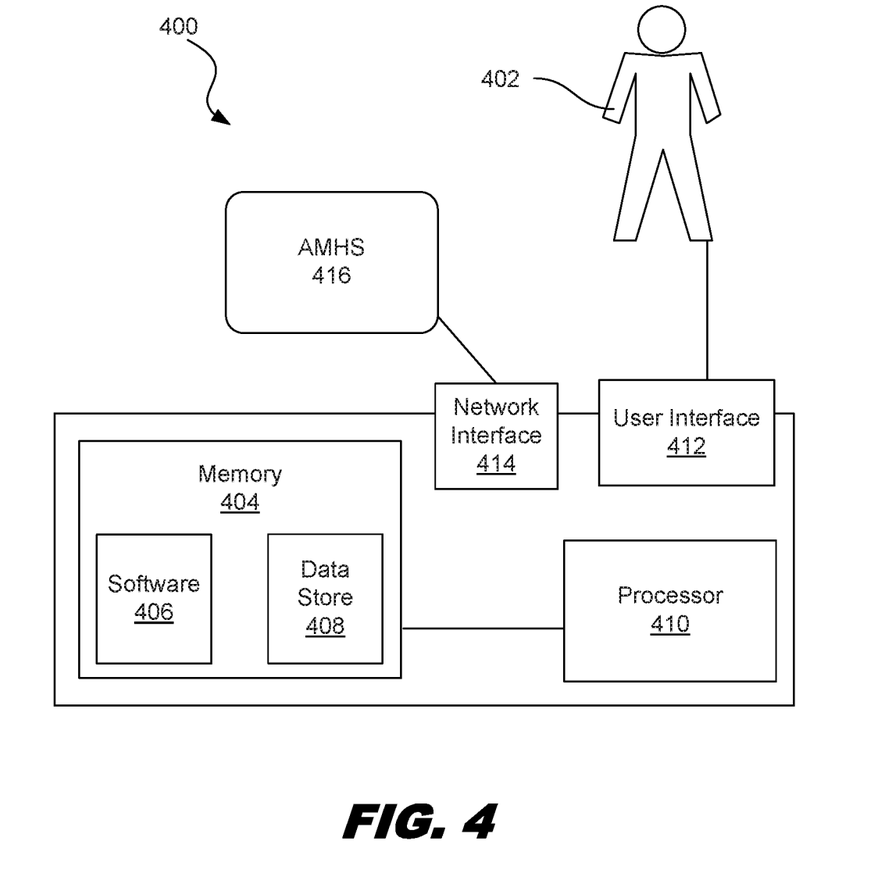
FIG. 4 is a diagram showing an illustrative computing system to run an automated material handling system (AMHS), in accordance with some embodiments.

FIG. 4 is a diagram showing an illustrative computing system to run an automated material handling system (AMHS). According to certain illustrative examples, the processing system 400 includes a memory 404 which may include software 406 and a data store 408. The processing system 400 also includes a processor 410, a network interface 414, and a user interface 412.

The memory 404 may be one of several different types of memory. Some types of memory, such as solid state drives, are designed for storage. These types of memory typically have large storage volume but relatively slow performance. Other types of memory, such as those used for Random Access Memory (RAM), are optimized for speed and are often referred to as "working memory." The various types of memory may store information in the form of software 406 and data in the data store 408.

The processing system 400 also includes a processor 410 for executing the software 406 and using or updating the data 408 stored in memory 404. The software 406 includes sets of machine readable instructions that when executed by the processor 410, cause the system 400 to perform various tasks. The software 406 may include an operating system and any other software applications a user may wish to install. The software 406 may include machine readable instructions that cause the system 400 to control an AMHS 416.

The software for an AMHS may define what FOUPs are to be picked up at what time and to where they should be transported. An AMHS 416 for a large semiconductor fabrication facility may require careful planning to manage the large volume of FOUPs that need to be transported. Additionally, the software 416 may control the movements of the carriers and loading mechanisms. Thus, the software 416 is programmed to cause the carriers to rotate appropriately in order to latch onto FOUPs. Additionally, the software causes the carriers to latch additional FOUPs onto the bottom of FOUPs already being held by the carriers.

The user interface 412 may include a number of input devices such as a mouse, touchpad, or touchscreen that allow the user 402 to interact with the computing system 400. The user interface 412 may also include a number of different types of output devices such as a monitor or a touchscreen. The user interface allows the user 402 to monitor the status of the AMHS 416 or make adjustments to the AMHS 416 as may be desired.

The network interface 414 may include hardware and software that allows the processing system 400 to communicate with other processing systems over a network 416. The network interface 414 may be designed to communicate with the network 416 through hardwire media such as Ethernet, coaxial, fiber-optic, etc. The network interface 416 may also be designed to communicate with the network 416 using wireless technologies. The network interface 414 allows a user to connect to external databases for purposes of comparing hash results to various databases of hash results.

Figure 5:
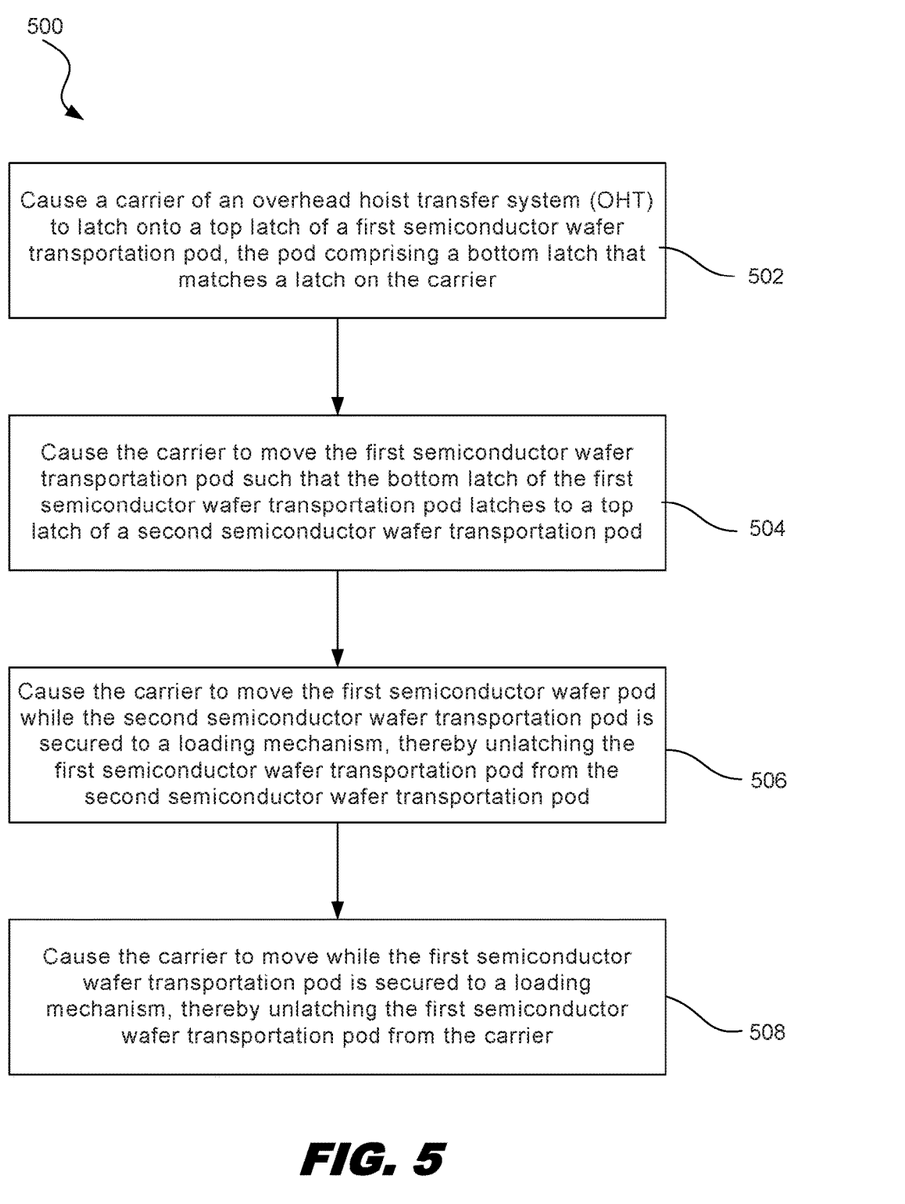
FIG. 5 is a flowchart showing an illustrative method for semiconductor wafer transportation, in accordance with some embodiments.

FIG. 5 is a flowchart showing an illustrative method 500 for semiconductor wafer transportation. According to certain illustrative examples, the method 500 includes a step 502 for causing a carrier of an overhead hoist transfer system (OHT) to latch onto a top latch of a first semiconductor wafer transportation pod, the pod comprising a bottom latch that matches a latch on the carrier. In some examples, the top latch of the first semiconductor wafer transportation pod may connect to the bottom latch of the carrier through rotation.

The method 500 further includes a step 504 for causing the carrier to move the first semiconductor wafer transportation pod such that the bottom latch of the first semiconductor wafer transportation pod latches to a top latch of a second semiconductor wafer transportation pod. This may be done in a manner similar to the carrier latching onto the first semiconductor wafer transportation pod.

To unload the pods, the method may further include a step 506 for causing the carrier to move the first semiconductor wafer pod while the second semiconductor wafer transportation pod is secured to a loading mechanism, thereby unlatching the first semiconductor wafer transportation pod from the second semiconductor wafer transportation pod. Again, this may be done by rotation. The direction of rotation for unlatching is opposite of the direction for latching.

The method 500 may further include a step 508 for causing the carrier to move while the first semiconductor wafer transportation pod is secured to a loading mechanism, thereby unlatching the first semiconductor wafer transportation pod from the carrier. Again, this may be done by rotation.

Systems and methods that utilize principles described herein provide for more efficient semiconductor fabrication. Specifically, by attaching more than one universal transportation pod to a single carrier, more pods can be transferred within a given time frame. This allows for more flexibility in an AMHS design, thus allowing for more efficiency.

According to one embodiment, a wafer transportation pod includes a body, a main compartment enclosed by the body, the main compartment to provide a controlled environment, a holding device within the main compartment, the holding device to hold a number of semiconductor wafers, a top latching mechanism configured to connect to another pod or a carrier mechanism of an overhead hoist transfer (OHT) system, a bottom latching mechanism configured to connect to another pod, the bottom latching mechanism being similar to the latching mechanism on the carrier.

According to one embodiment, a semiconductor wafer pod transportation system includes a carrier mechanism comprising a carrier latch to connect to a top latch of a first semiconductor wafer transportation pod, the first semiconductor wafer pod comprising a body, a main compartment enclosed by the body, the main compartment to provide a controlled environment, a holding device within the main compartment, the holding device to hold a number of semiconductor wafers, and a bottom latch that is similar to the carrier latch.

According to one embodiment, a method for operating an overhead hoist transfer system (OHT) includes causing a carrier of an overhead hoist transfer system (OHT) to latch onto a top latch of a first semiconductor wafer transportation pod, the pod comprising a bottom latch that matches a latch on the carrier, and causing the carrier to move the first semiconductor wafer transportation pod such that the bottom latch of the first semiconductor wafer transportation pod latches to a top latch of a second semiconductor wafer transportation pod.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    causing a carrier of an overhead hoist transfer system (OHT) to latch onto a first semiconductor wafer transportation pod, the first semiconductor wafer transportation pod comprising a top latching mechanism configured to selectively connect to another pod or a carrier mechanism of the OHT system, and a bottom latching mechanism configured to selectively connect to another pod; and
    rotating the first semiconductor wafer transportation pod such that the top latching mechanism of the first semiconductor wafer transportation pod latches on to a second semiconductor wafer transportation pod.

2. The method of claim 1, wherein the first semiconductor wafer transportation pod comprises a body.

3. The method of claim 2, wherein the first semiconductor wafer transportation pod comprises, a main compartment enclosed by the body, the main compartment configured to provide a controlled environment.

4. The method of claim 3, wherein the first semiconductor wafer transportation pod comprises a holding device within the main compartment, the holding device to hold a plurality of semiconductor wafers.

5. The method of claim 1, wherein the first semiconductor wafer transportation pod is configured for use with an Automated Material Handling System (AMHS).

6. The method of claim 1, wherein the first semiconductor wafer transportation pod comprises a front opening door.

7. The method of claim 1, wherein the top latching mechanism is positioned at a center of a top of the first semiconductor wafer transportation pod.

8. The method of claim 1, wherein the bottom latching mechanism is positioned at a center of a bottom of the first semiconductor wafer transportation pod.

9. The method of claim 1, wherein the second semiconductor wafer transportation pod includes a top latching mechanism configured to selectively connect to another pod or the carrier mechanism, and a bottom latching mechanism configured to selectively connect to another pod.

10. A method comprising:
    with an overhead hoist transfer system (OHT) latching onto a first semiconductor wafer transportation pod, the first semiconductor wafer transportation pod comprising a top latching mechanism and a bottom latching mechanism, the bottom latching mechanism being similar to a latching mechanism configured to latch with a latching mechanism matching the top latching mechanism;

with the OHT system, rotating the first semiconductor wafer transportation pod such that the top latching mechanism of the first semiconductor wafer transportation pod latches on to a second semiconductor wafer transportation pod.

11. The method of claim 10, wherein the second semiconductor wafer transportation pod is substantially identical to the first semiconductor wafer transportation pod.

12. The method of claim 11, further comprising, rotating both the first semiconductor wafer transportation pod and the second semiconductor wafer transportation pod together to cause the second semiconductor wafer transportation pod to latch onto a third semiconductor wafer transportation pod.

13. The method of claim 12, wherein the third semiconductor wafer transportation pod is substantially identical to the first and second semiconductor wafer transportation pods.

14. The method of claim 13, wherein a top latch of the third semiconductor wafer transportation pod being attached to a bottom latch of the second semiconductor wafer transportation pod.

15. The method of claim 10, wherein the first semiconductor wafer transportation pod comprises a front opening door.

16. The method of claim 10, wherein the top latching mechanism is positioned at a center of a top of the first semiconductor wafer transportation pod.

17. The method of claim 10, wherein the bottom latching mechanism is positioned at a center of a bottom of the first semiconductor wafer transportation pod.

18. A method for operating an overhead hoist transfer system (OHT), the method comprising:

causing a carrier of an overhead hoist transfer system (OHT) to latch onto a top latch of a first semiconductor wafer transportation pod, the first semiconductor wafer transportation pod comprising a bottom latch that matches a latch on the carrier; and causing the carrier to move the first semiconductor wafer transportation pod such that the bottom latch of the first semiconductor wafer transportation pod latches to a top latch of a second semiconductor wafer transportation pod.

19. The method of claim 18, further comprising, causing the carrier to move the first semiconductor wafer transportation pod while the second semiconductor wafer transportation pod is secured to a loading mechanism, thereby unlatching the first semiconductor wafer transportation pod from the second semiconductor wafer transportation pod.

20. The method of claim 19, further comprising, causing the carrier to move while the first semiconductor wafer transportation pod is secured to a loading mechanism, thereby unlatching the first semiconductor wafer transportation pod from the carrier.

* * * * *